United States Patent [19]

Falkner, Jr. et al.

[11] Patent Number: 5,303,457
[45] Date of Patent: Apr. 19, 1994

[54] METHOD FOR PACKAGING MICROELECTRONIC FREQUENCY SELECTION COMPONENTS

[75] Inventors: Robert F. Falkner, Jr., Phoenix; Russell T. Fiorenzo, Scottsdale, both of Ariz.

[73] Assignee: Motorola, Inc., Schaumburg, Ill.

[21] Appl. No.: 918,771

[22] Filed: Jul. 27, 1992

Related U.S. Application Data

[63] Continuation of Ser. No. 650,117, Feb. 4, 1991, abandoned.

[51] Int. Cl.$^5$ .............................................. B65C 9/25
[52] U.S. Cl. ................................... 29/25.35; 156/322; 156/327
[58] Field of Search ................. 156/89, 282, 300, 320, 156/322, 330.9, 327, 326, 330; 437/209, 220, 215, 216, 217; 29/25.35, 830, 854, 594

[56] References Cited

U.S. PATENT DOCUMENTS

| | | | |
|---|---|---|---|
| 4,312,692 | 1/1982 | Ikeda et al. | 156/327 |
| 4,356,047 | 10/1982 | Gordon et al. | 156/89 |
| 4,459,166 | 7/1984 | Dietz et al. | 156/89 |
| 4,592,794 | 6/1986 | Davis et al. | 156/89 |
| 4,789,947 | 11/1988 | Butt | 437/221 |
| 4,906,311 | 3/1990 | Gurol | 156/89 |

OTHER PUBLICATIONS

A. Shores, "Thermoplastic Films for Adhesive Bonding Hybrid Microcircuit Substrates" 1989 Electronic Components Conf. Aug. 1989.
An article entitled "SBAR Filter Monolithically Integrated with HBT Amplifier" by D. Cushman et al., presented at the 1990 IEEE Ultrasonics Symposium, Honolulu, HI, Dec. 1990.
An article entitled "Volatile Species from Conductive Die Attach Adhesives" by R. C. Benson et al., presented at the Proceedings IEEE Electrical Components Conference, IEEE Catalogue No. 89CH2775-5, Mar. 1, 1989, pp. 301-308.
An article entitled "Thermoplastic Films for Adhesive Bonding Hybrid Microcircuit Substrates", by A. Andrew Shores, 1989 Electronic Components Conference, Aug. 1989.
An article entitled "Hybrid Die-Attach Move With the Forces" by Ronald Pound, Electronic Packaging & Production, Feb. 1989.

*Primary Examiner*—Jan H. Silbaugh
*Assistant Examiner*—Christopher A. Fiorilla
*Attorney, Agent, or Firm*—Frederick M. Fliegel; Frank J. Bogacz

[57] ABSTRACT

A package for a frequency selection component includes a base, a thermoplastic die attachment, and either a soldered or low-melting-temperature glass lid attachment. These techniques can be employed in either a leadless chip carrier or a single layer ceramic base configuration. A package for a surface acoustic wave device in accordance with one embodiment of the invention is suitable for enclosing the device in a hermetically sealed environment such that the resulting structure takes up a minimum volume of space. The package facilitates automated circuit assembly techniques, allowing compact, low cost products to incorporate frequency selection components when these are made in accordance with the present invention.

11 Claims, 3 Drawing Sheets

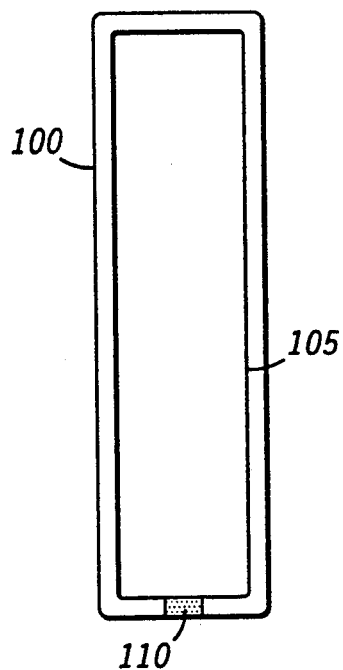
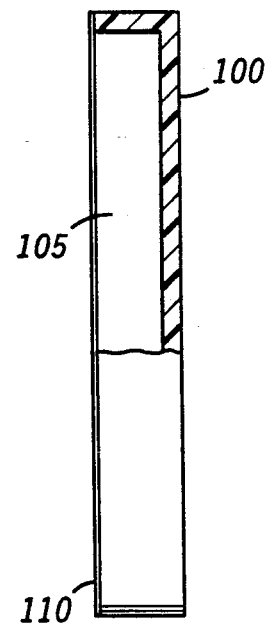
*FIG. 5A*  *FIG. 5B*
*FIG. 6A*
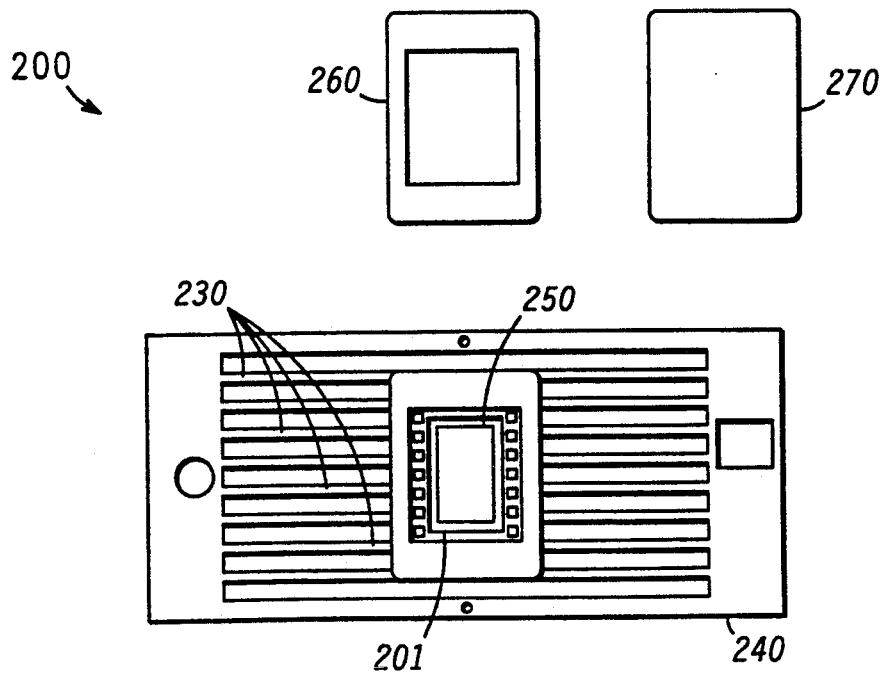

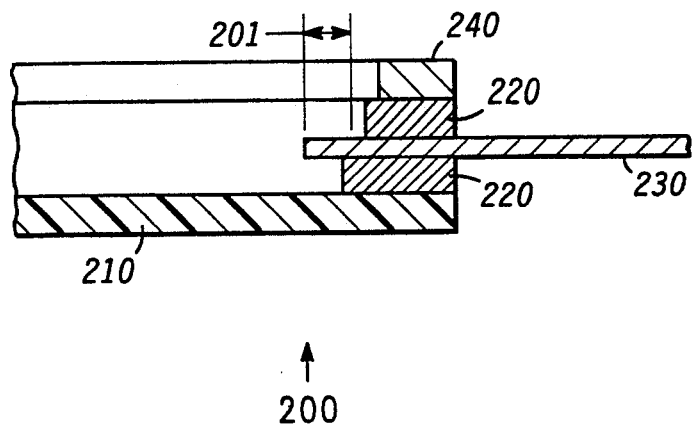
FIG. 6B
FIG. 7
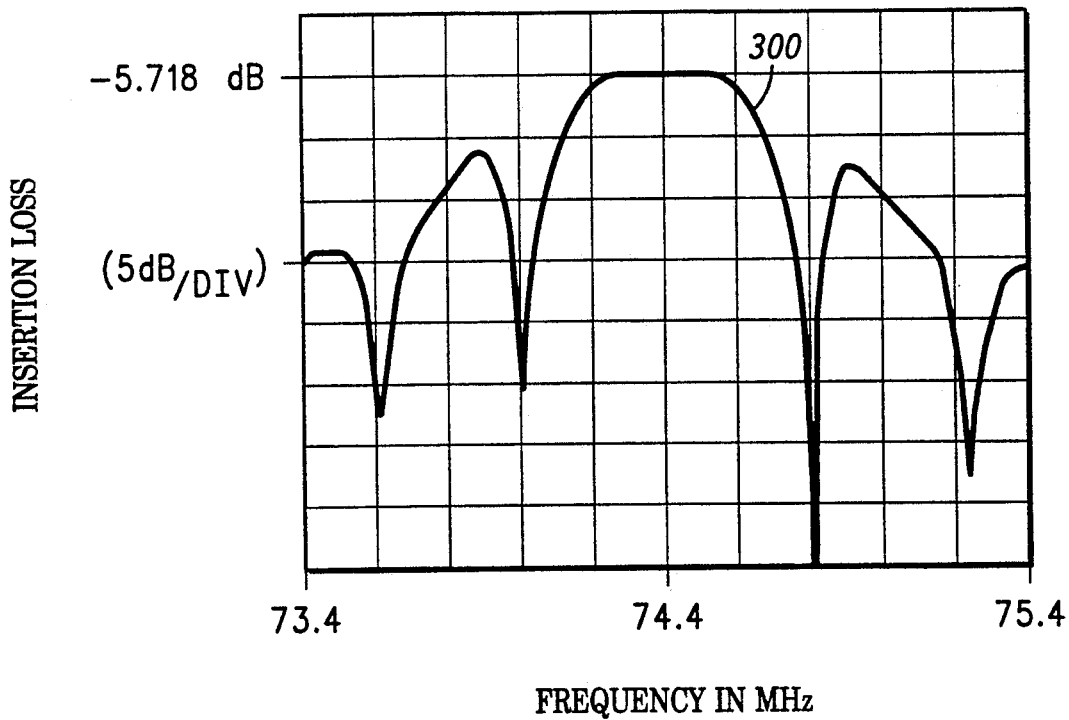

METHOD FOR PACKAGING MICROELECTRONIC FREQUENCY SELECTION COMPONENTS

This application is a continuation of prior application Ser. No. 650,117, filed Feb. 4, 1991 now abandoned.

BACKGROUND OF THE INVENTION

This invention relates to packages for microelectronic frequency selection components such as surface acoustic wave (SAW) devices and more specifically to housings suitable for mass assembly of packaged hermetically sealed devices.

At the present time, much effort and expense is devoted to research and development relating to microelectronic frequency selection devices. Examples of devices which fall into this category are film bulk acoustic wave resonators (FBARs) (see, for example, "SBAR filter monolithically integrated with HBT amplifier," by D. Cushman et al., presented at the 1990 IEEE Ultrason. Symp., Honolulu, Hi., December 1990) and surface acoustic wave devices. Inasmuch as many such devices derive their electrical properties from mechanical motion of some portion of the device, events which affect that motion can in turn affect the frequency selection characteristics of such devices. Circuits including this type of device tend to provide fairly compact frequency selection components while taking up minimal space. However, the volume reduction achieved by improved packaging techniques can be as much as 100:1 as compared to other device packaging methods. These devices are not usable for practical applications unless they can be enclosed in and protected by proper hermetic packages or housings.

Prior art packages for such device chips tend to be expensive and tend to be much larger than the device enclosed within. While some prior art packages allow mounting of die within the package in a small area, the packages themselves require excessive amounts of space. This is because some such packages utilize leads that extend beyond the boundaries of the package. These leads often must be tied down to conductors on a substrate surface and then brought from the conductors on the substrate to an adjacent package. This requires that sufficient space be maintained between the prior art packages to facilitate the required electrical and mechanical connections.

Prior art die bonding by use of thermosetting polymers can result in trapping of contaminants in the polymer or in substantial outgassing of reaction products from the polymer on heating. These contaminants result in greatly impaired device performance when they condense on the frequency selection component surface, by promoting attenuation of the mechanical vibrations and thereby greatly diminishing the magnitude of the desired output signals.

For example, epoxies outgas large proportions of their mass during cure. Three leading brand adhesives tested by John Hopkins University scientists (Proc. IEEE Elec. Comp. Conf., IEEE Catalogue No. 89CH2775-5, pp. 301-308), outgassed 9 to 36% of their mass during cure. Such significant outgassing can result in void formation, diminishing the strength of the die bond, and can also result in re-deposition of heavier organic chemicals on the frequency selection component surface.

An additional problem occurs when automated machine placement and assembly of such components is attempted. This is due to bending of the leads during insertion into appropriately treated holes in the substrate, causing unreliable connections of the part to the surrounding circuitry.

Moreover, frequency selection components require hermetically sealed environments in order to work reliably. This has led to use of metallic packages, such as TO-5 and TO-8 containers, and various types of dual-in-line packages, which are individually resistance or seam welded. Due to the piezoelectric nature of the materials required for many types of frequency selection devices, such as surface wave filters, surface skimming bulk wave filters, shallow bulk acoustic wave filters, and the like, these devices must not be exposed to temperatures above the substrate Curie temperature. Such welding techniques produce adequately sealed hermetic packages without exposing the die to excessive heat. However, these manufacturing techniques are not well suited to batch processing, resulting in high costs which are prohibitive for high volume consumer product manufacturing.

Further, SAW die require mounting techniques and materials which do not result in stresses in the mounted die. Such stresses cause random phase distortion and frequency response distortion in the finished part.

SUMMARY OF THE INVENTION

Accordingly, one advantage of the present invention is to provide packages for frequency selection devices which enable compact final product configurations by allowing the packages to be mounted side-by-side with substantially no wasted space between them.

Another advantage of the present invention is to provide packages for frequency selection devices which provide a hermetically sealed environment and yet which occupy as little volume as is possible.

Still another advantage of the present invention is to provide low cost, easily manufactured packages for SAWs which can be easily handled by automated circuit assembly apparatus to enable efficient mass production of products incorporating such devices.

This invention discloses a method for frequency selection component die or semiconductor circuit die packaging. The frequency selection component die is bonded to a package base which has conductors disposed thereon with thermoplastic die attachment material. Electrical interconnections are formed from the frequency selection component to the package base conductors, and a lid is hermetically sealed to the package base.

There is provided a method for packaging piezoelectric frequency selection component die comprising the steps of: providing a package base having conductors disposed thereon; providing a surface acoustic wave frequency selection component die comprising a piezoelectric substrate material; disposing thermoplastic die attachment material between the package base and the die to form an assembly, wherein the thermoplastic die attachment material is selected from the group consisting of polyethetherketone, polysulfone, polyethersulfone, polyetherimid, polyutlyeneterepthalate and polycarbonate; heating the assembly to a bonding temperature of the thermoplastic die attachment material; cooling the assembly to effect a bond between the package base and the die by means of the thermoplastic die attachment material without scrubbing of the die relative to the package base; forming electrical interconnections from the frequency component die to the package base; and hermetically sealing a lid to the package base.

BRIEF DESCRIPTION OF THE DRAWINGS

FIG. 5A is a bottom view of the package lid, in accordance with the present invention.

FIG. 5B is a partially cut-away cross-sectional view of the package lid, in accordance with the present invention.

FIG. 6A is a plan view of an alternative package embodiment, in accordance with the present invention.

FIG. 6B is a cross-sectional view of a portion of the alternative package embodiment, in accordance with the present invention.

FIG. 7 is a diagram of a measured SAW filter transfer function from a SAW device mounted in accordance with the present invention.

DETAILED DESCRIPTION OF THE PREFERRED EMBODIMENT

Figure 1:
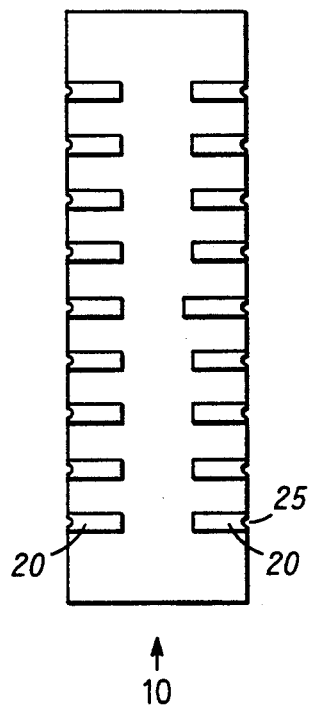
FIG. 1 is a plan view of the bottom surface of the package base, in accordance with the present invention.

FIG. 1 illustrates a bottom view of the package base 10, showing thick-film interconnection pads 20 and through-plated vias 25.

Figure 2:
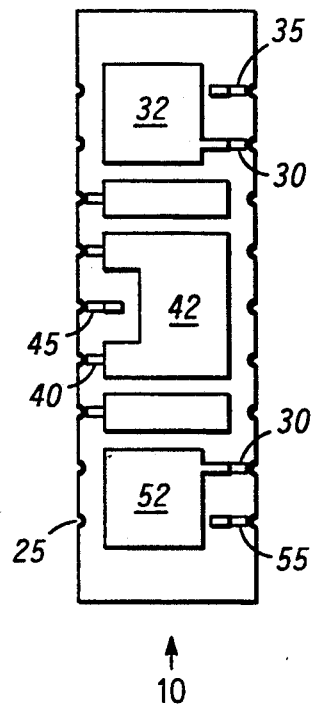
FIG. 2 is a plan view of the top surface of the package base, in accordance with the present invention.

FIG. 2 depicts a top view of the package base 10, with thick-film conductors 30, 35, 40, 45, 50, and 55. The conductors 30, 35, 40, 45, 50, and 55 make contact with through-plated vias 25 to effect electrical connection to the interconnection pads 20 on the lower surface of the package base 10.

Figure 3:
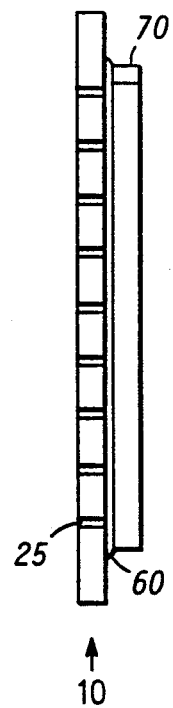
FIG. 3 is a side view of the package base with a SAW mounted on the package base, in accordance with the present invention.

FIG. 3 illustrates a side view of the package base 10 with a thermoplastic die attach material 60 and a frequency selection component die, for example a surface acoustic wave (SAW) die 70, attached thereto. The thermoplastic die attachment adhesive 60 may be any of several such materials, depending on the melting point desired for a particular application. Table 1 provides several illustrative examples of thermoplastic die attachment materials 60 together with the temperatures needed for forming bonds with these examples.

Figure 4A:
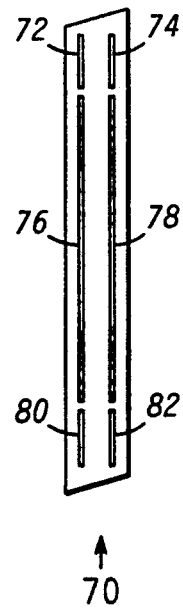
FIG. 4A is a top view of a surface acoustic wave device.

FIG. 4A shows a top view of a SAW device die 70, with bond pad areas 72, 74, 76, 78, 80, and 82 illustrated. These bond pad areas 72, 74, 76, 78, 80, and 82 are interconnected by means of wire bonds 27 to portions of conductor regions 32, 35, 42, 45, 52, and 55, respectively, of FIGS. 2 and 4B. The wire bonds 27 are made to those portions of the conductor regions 32, 42, and 52 as shown

TABLE 1

| BONDING TEMPERATURES FOR SEVERAL THERMOPLASTIC MATERIALS | |
|---|---|
| MATERIAL | BONDING TEMPERATURE (°C.) |
| Polyetheretherketone | 360 |
| Polysulfone | 300-380 |
| Polyethersulfone | 320-380 |

TABLE 1-continued

Figure 4B:
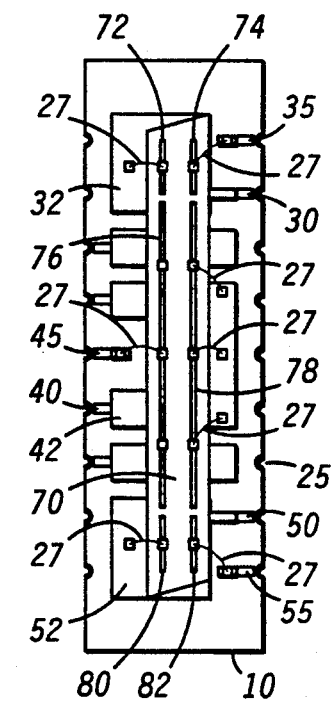
FIG. 4B is a top view of a surface acoustic wave device mounted on a package base, in accordance with the present invention.

| BONDING TEMPERATURES FOR SEVERAL THERMOPLASTIC MATERIALS | |
|---|---|
| MATERIAL | BONDING TEMPERATURE (°C.) |
| Polyetherimide | 340-380 |
| Polybutlyeneterepthalate | 240 |
| Polycarbonate | 230-290 | in FIG. 4B which are not covered by the thermoplastic die attach material 60 beneath the SAW die 70 and which are also not located where the low-melting-temperature glass 110 attaches the lid 100 to the package base 10 as shown in FIG. 5A. The portions of conductor regions 32, 42, and 52 which are covered by thermoplastic die attach material 60 serve as die attach pads, however, die attach pads are not necessary to this concept for die attachment.

One example of a low-melting-temperature glass 110 is a mixture of PbO and $V_2O_5$. This can be used with a two minute bake at 360° C. to seal the lid 100 to the package base 10.

FIG. 5A provides a plan view of the bottom of the ceramic lid 100, with the central region 105 hollowed out, as is shown in FIG. 5B.

FIG. 5B is a partial cross-sectional view cut-away along line A—A in FIG. 5A of the ceramic lid 100 and low-melting-temperature glass 110.

FIG. 6A depicts a plan view and FIG. 6B is a partial cross-sectional view of an alternative embodiment of the package 200. In this embodiment, the package base 200 is shown in FIG. 6B to be composed of a layer of ceramic material 210, which has gold-plated Kovar leads 230 in a gold-plated Kovar lead frame 240 sealed to the ceramic material 210 by fused glass 220. The glass-free area 201 of the gold-plated Kovar lead 230 inside the package base 200 is used for bonding of interconnection wires 27 from the bond pads 72, 74, 76, 78, 80 and 82 of the SAW die 70, as was shown in FIG. 4B.

SAW die 70 is attached to the die bonding pad 250 by means of a thermoplastic die attach material 60 and electrical connection to the SAW die 70 is made by means of wire-bonds 27 as described and illustrated previously in FIG. 4B. Subsequent to the wirebonding operation, a solder preform 260 is placed on top of the upper metallized ring 240. A lid 270 is placed on top of the solder preform 260 and the lid 270 is soldered to the upper metallization 240, hermetically sealing the lid 270 to the package base 200.

An example of a measured SAW transmission frequency response 300 from a SAW device mounted in accordance with the present invention is provided in FIG. 7. The data shown in FIG. 7 illustrate that the device response 300 is in accordance with the SAW device design, showing that the packaging steps in accordance with the present invention does not inhibit the operation of the SAW device 70.

A package 200 for a microelectronic device such as a circuit surface acoustic wave device 70 or a semiconductor circuit die in accordance with one embodiment of the invention is suitable for enclosing the SAW device 70 in a hermetically sealed environment such that the resulting structure 200 takes up a minimum volume of space. The package 200 may include a die pad 250 for the surface acoustic wave die 70 and does include a thermoplastic adhesive 60 for affixing the SAW die 70 to the package base 210 without causing the top surface of the SAW die 70 to be in excessive compression or tension, either of which causes device malfunction. The thermoplastic die attach adhesive 60 allows the SAW device 70 to be exposed to greater temperatures than prior art enabled without suffering SAW die 70 contamination from outgassing of the die attach adhesive 60. This in turn allows the cover 270 to be affixed to the package base 200 by means of solder 260 to hermetically seal the SAW die 70 from the surrounding environment. The base 210, thermoplastic die attach adhesive 60, cover 270, and cover attach solder 260 cooperate to provide a package which encloses and protects the SAW die 70.

While the invention has been described in conjunction with specific embodiments thereof, it is evident that many alterations, modifications and variations will be apparent to those skilled in the art in light of the foregoing description. Accordingly, the invention is intended to embrace all such alterations, modifications and variations in the appended claims.

We claim:

1. A method for packaging piezoelectric frequency selection component die comprising the steps of:
   providing a package base having conductors disposed thereon;
   providing a surface acoustic wave frequency selection component die comprising a piezoelectric substrate material;
   disposing thermoplastic die attachment material between the package base and the die to form an assembly, wherein the thermoplastic die attachment material is selected from the group consisting of polyetherketone, polysulfone, polyethersulfone, polyetherimid, polybutyleneterepthalate and polycarbonate;
   heating the assembly to a bonding temperature of the thermoplastic die attachment material;
   cooling the assembly to effect a bond between the package base and the die by means of the thermoplastic die attachment material without scrubbing of the die relative to the package base;
   forming electrical interconnections from the frequency component die to the package base; and
   hermetically sealing a lid to the package base.

2. The method for packaging of a frequency selection component die as claimed in claim 1, wherein said step of forming electrical interconnections from the frequency selection component die to the package base conductors includes the step of wirebonding from the frequency selection component die to the package base conductors.

3. The method for packaging of a frequency selection component die as claimed in claim 1, wherein said step of hermetically sealing a lid to the package base includes the step of soldering a lid to the package base.

4. The method for packaging a frequency selection component die as claimed in claim 3, wherein said step of soldering the lid to the package base includes the step of soldering a metal lid to the package base.

5. The method for packaging of a frequency selection component die as claimed in claim 1, wherein said step of forming a bond between the package base and the die includes the step of cooling an assembly of the package base, thermoplastic die attachment material, and die prior to hermetically sealing the lid to the package base.

6. The method for packaging a frequency selection component die as claimed in claim 1, wherein said step of providing a lid hermetically sealed to the package base includes the steps of:
   applying a low-firing-temperature glass to the package base or lid;
   placing the lid on the package base with the glass therebetween;
   heating the low-firing-temperature glass, package base, thermoplastic die attachment material and lid to melt the low-melting-temperature glass and thermoplastic die attachment material; and
   cooling the low-firing-temperature glass, package base, the thermoplastic die attachment material and lid to resolidify the thermoplastic die attachment material and form a hermetically sealed packaged frequency selection component die assembly.

7. The method for packaging a frequency selection component die as claimed in claim 6, wherein the glass melts at a temperature equal to or higher than the thermoplastic die attachment material.

8. The method for packaging a frequency selection component die as claimed in claim 6, wherein said step of providing a lid comprises providing a glass or ceramic lid.

9. A method for frequency selection component die packaging comprising the steps of:
   providing a frequency selection component die comprising a piezoelectric material;
   providing a package base having conductors disposed thereon;
   disposing thermoplastic die attachment material on the package base wherein the thermoplastic die attachment material is selected from the group consisting of polyethetherketone, polysulfone, polyethersulfone, polyetherimid, polybutlyeneterepthalate and polycarbonate;
   placing the die on the thermoplastic die attachment material;
   heating the thermoplastic die attachment material to a bonding temperature of the thermoplastic die attachment material;
   cooling the thermoplastic die attachment material to effect a bond between the package base and the die by means of the thermoplastic die attachment material without scrubbing of the die relative to the package base;
   forming electrical interconnections from the frequency component die to the package base; and
   hermetically sealing a lid to the package base with a sealing material.

10. The method for packaging a frequency selection component die as claimed in claim 9, wherein said step of bonding includes the steps of:
    placing thermoplastic die attachment material on the package base;
    then in either order, heating the package base and thermoplastic die attachment material to a first temperature to a first temperature and placing the frequency selection component die on the thermoplastic die attachment material; and
    cooling the package base, thermoplastic die attachment material and frequency selection component die.

11. The method for packaging a frequency selection component die as claimed in claim 10, further comprising, thereafter hermetically attaching a lid over the component die by reheating the package base to a second temperature equal to or greater than the first temperature.

* * * * *